May 28, 1968 J. W. MAYER ETAL 3,385,981

DOUBLE INJECTION TWO CARRIER DEVICES AND METHOD OF OPERATION

Filed May 3, 1965

INVENTORS.
JAMES W. MAYER,
OGDEN J. MARSH,
ROBERT E. BARON,
GERALD S. PICUS,
BY
Charles F. Hauscher
their ATTORNEY.

United States Patent Office 3,385,981
Patented May 28, 1968

3,385,981
DOUBLE INJECTION TWO CARRIER DEVICES AND METHOD OF OPERATION

James W. Mayer, Pacific Palisades, Ogden J. Marsh, Woodland Hills, Robert E. Baron, Los Angeles, and Gerald S. Picus, Woodland Hills, Calif., assignors to Hughes Aircraft Company, Culver City, Calif., a corporation of Delaware Filed May 3, 1965, Ser. No. 452,939
6 Claims. (Cl. 307—299)

ABSTRACT OF THE DISCLOSURE

Forward biased devices having an intrinsic region subject to double injection mode operation in pulse mode operation below double injection current as a magnetic field controller and as a photoconductor device.

This invention relates to double injection semiconductor devices for operation in the two carrier mode under forward bias, and is particularly useful in radiation responsive applications where currents are to be generated responsive to nuclear, particle, gamma, light and other types or classes of radiation which are capable of generating electron-hole pairs in the device material.

As used herein, semiconductor materials include materials, other than metals, which may be normally insulating, but which may be induced to carry current by suitable application of contact voltage, radiation, or the like, including materials often referred to as semi-insulators.

Semiconductor radiation detectors are well known, and are operated in reverse-bias condition to produce a radiation sensitive depletion zone. Photosensitive devices may be operated under reverse bias to produce current, and generally with high impedance and high voltages which place limitations on the use which may be made of such devices due to stringent equipment requirements, for example, for amplifiers. Reverse bias interrupts current through the depletion zone so that small signals due to radiation-induced current carriers can be detected in the absence of large normal currents. The active radiation sensitive receiving area is proportioned to the reverse bias voltage which produces the depletion region.

It is proposed to use a P-I-N structure semiconductor device, where the I region is either intrinsic, lightly doped with P-type material ($\pi$ type) or lightly doped with N type material ($\nu$-type) and the respective P and N regions form injecting contacts to the I region. The carriers must have high mobilities to reduce transit time for a given geometry, or I region width, and long carrier lifetimes such that carriers can be swept across the I region in less than a lifetime. Since the current gain G is equal to the ratio of lifetime $\tau$ to transit time $t$, or $G=\tau/t$, then current gains of greater than one are possible where for at least one carrier $\tau>t$. In the double injection mode $\tau>t$ for both carriers, (both electron and hole carriers), less sensitivity is obtained, but lower noise, thus a better signal to noise ratio, is obtained. With forward bias, the depth of the active I region is independent of bias.

Where a forward biased photoconductive device as above described is subjected to light radiation, then the "light current," due to bias plus radiation, exceeds the "dark current," due to bias in the absence of radiation. The sensitivity to light therefore increases in the double injection mode, and especially where $\tau>t$ for both carriers, and current may approach a $V^2$ relationship on an I–V plot. The increased current due to radiation induced current is free from some sources of noise, and in the double injection mode a relatively low noise is produced, and in fact noise suppression is found.

When such photoconductive devices are operated under steady-state illumination in the pulse mode of forward bias, the rise time of the dark, double injection, current is longer than the photo current response, and with pulse intervals longer than the pulse duration, preferably exceeding three times the pulse duration, suitable filters may be used to isolate the photo signal before the pulse current rises sufficiently to mask the photo current. Very sensitive pulse-mode photo-current detectors are thus possible. In this manner, higher gains are obtainable with higher voltages producing lower transit times and retaining higher ratios of light to dark current $I_e/I_d$. Due to the large radiation receiving areas possible, very effective dosimeters for unfocused light or X-rays are obtainable, and increased currents, low current drain in the off condition, and reduced noise levels are obtained.

The double injection photosensitive PIN device may be operated in a magnetic field, in which case double injection dark current is suppressed, and accordingly higher voltages may be used, extending the range and usefulness of the device. This magnetic field suppression of double injection dark current makes possible use of the device as a closed loop control device for maintaining an electromagnetic field.

There are three semiconductor (or semi-insulator) material requirements for forward bias operation that are quite distinct from those for reverse biased devices. First, dual mobility; the electron mobility, $\mu_n$, must be not more than 100 times the hole mobility $\mu_p$ for a practical device, i.e. $\mu_n/\mu_p>100$. This and the following limitations are practical, or approximate, rather than critical, ones. This limitation is selected to allow both carriers to traverse the I region in less than their effective lifetimes.

Materials having this characteristic are diverse and include germanium, silicon, cadmium telluride, gallium arsenide, and cadmium selenide, but do not include such materials as cadmium sulfide whose $\mu_n/\mu_p>100$. Materials whose $\mu_n/\mu_p$ is greater than about 100 are effectively single carrier materials. Although cadmium sulfide is a classical photoconductor material, it is unsuitable for this invention because its relatively low hole mobility and lifetime precludes adequate two-carrier operation.

The second requirement for the material is that the net number of impurities in the I region is very small, $\leq 10^{12}$ atoms per cubic centimeter; the number of donors less the number of acceptors must be small enough for the material to be very high resistance and/or intrinsic. In silicon at room temperature, the number of intrinsic carriers, is about $10^{10}$, and can be obtained in lithium-drifted silicon or germanium where the net impurity concentration may be less than $10^8$.

The third material requirement relates the material to the device configuration; the carrier lifetimes should be large enough so that the holes and electrons can be swept across the device in times less than a carrier lifetime, or $EL^2/\mu\gamma$, where E is the carrier lifetime, L is the length of the I region, $\mu$ is the carrier mobility and V is the bias voltage.

The contacts to the high resistivity region of the device must be injecting, usually through alloyed or diffused junctions. N+—I junctions are electron injecting contacts, and P+—I junctions are hole injecting contacts. Metal ohmic contacts are made to the N+ and P+ regions. With injecting contacts, ohmic first power currents flow at low voltages, and at increased voltages current rises proportional to higher powers of the applied voltage. The transition between the ohmic and conductivity modulated portions of the current-voltage characteristic occurs at a voltage such that both carrier transit times, become less than their respective lifetime. Thus the third condition for the material as previously stated occurs, for dark current above a critical forward bias voltage, forming a practical lower voltage limit for two-carrier operation.

Figure 1:
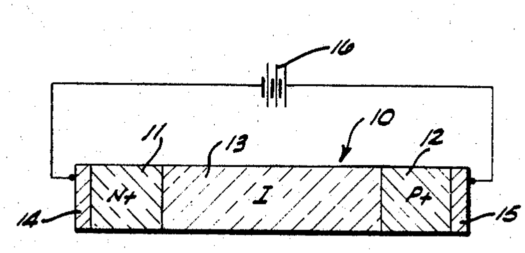
FIG. 1 is a schematic illustration of a device according to this invention.

FIG. 1 illustrates a semiconductor two-carrier photoconductor according to this invention, in which a semiconductor crystal 10 of silicon, for example, has injecting N+ and P+ regions 11 and 12 at opposite ends of an I region 13 of less than $10^{12}$ net carriers. Lithium drifted silicon is preferred for this region, but high resistivity material suitable for such devices is available. A length of about 100 mcrons to 1 cm. for the I region, depending on lifetimes, makes a very satisfactory device. Metal contacts 14 and 15 are made to the N+ and P+ junction forming regions, and for operation in the two-carrier mode bias terminals 16 are provided as shown, either DC bias or pulsed operation as will be discussed.

The N and P regions 11 and 12 may be formed by any of several conventional techniques, such as alloying gold-boron or gold-gallium for N-type and gold-antimony or gold-arsenic for P-type, to the silicon crystal 10 to form, by regrowth, crystal regions 11 and 12 of relatively high carrier concentration. Diffusion techniques may also be used to form an injecting junction, or contact, to the I region 13.

The I region may be semiconductor material containing both P-type and N-type impurities, the net, or excess, of one over the other being low, as in compensated material, or it may be one having a very low total number of impurities.

Injecting contacts or regions are used on both sides of the I region of FIG. 1.

Figure 2:
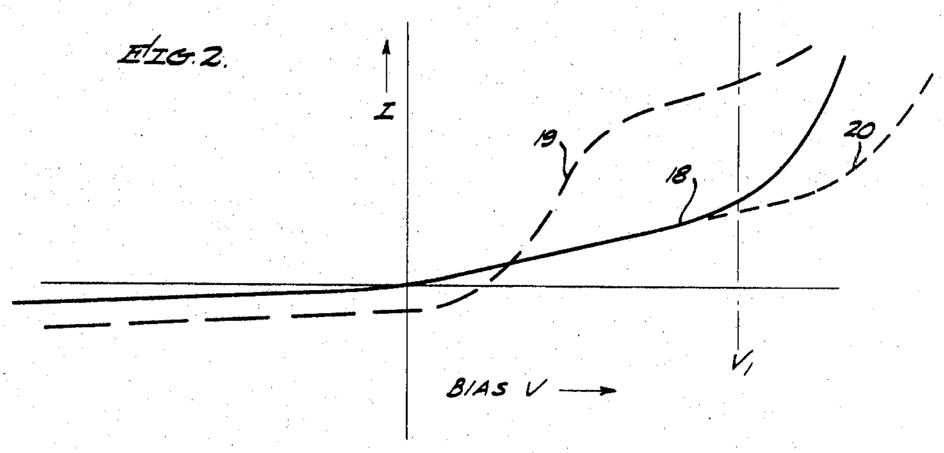
FIG. 2 is a current-voltage diagram illustrating operating characteristics of the device of FIG. 1.

FIG. 2 shows the current-voltage relations for device of FIG. 1. The reverse bias dark current, solid curve 18, is a conventional reverse, low current curve, and under forward bias current rises with voltage at substantially an ohmic proportion up to a voltage $V_i$ above which double-injection currents occur. Above $V_i$, due to "double-injection" currents, both positive and negative carriers support current and cause the total current curve 18 to rise above ohmic proportions.

Curve 19 of FIG. 2, shown as a dashed line, shows the photo-current, or the current under illumination. At reverse bias the current flow is increased somewhat. Under forward bias, the photo-current causes a marked increase in total current flow, exceeding ohmic proportions, to a voltage exceeding $V_i$. It is noted that above $V_i$, when the dark current rises faster than ohmic, noise is suppressed due to double injection or two-carrier, currents. Low noise operation is therefore available above $V_i$.

The length of the high resistivity, or I, zone 13 is not critical, so long as the transit time does not exceed the lifetimes of the carriers. Lengths up to several cm. are quite suitable and provide greater area for receiving radiation, thus making a sensing device more sensitive to a given radiation level.

Figure 3:
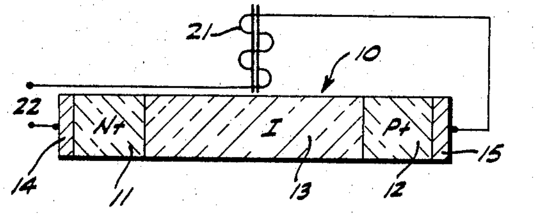
FIG. 3 illustrates an application of the device of FIG. 1 as a control element for controlling an electro-magnet.

The effect of double injection suppression in a transverse magnetic field leads to special applications of such forward biased devces. In FIG. 3, a device 10 having respective N+, P+ and I regions 11, 13 and 12 is connected through ohmic contacts 14 and 15 through an electromagnetic coil 21 to a voltage source 22. As voltage at the source 22 increases, an increased electromagnetic field suppresses double injection current in the I region 13, reducing the current to the electromagnets with fields of the order of one kilogauss or higher, the suppression of double injection current is particularly effective and practical. The current suppression effect is illustrated by dashed line 20 in FIG. 2.

What is claimed is:

1. The method of operating a forward biased PIN photoconductor device which comprises:

applying a series of forward bias voltage pulses, each larger than the voltage at which double injection currents appear, whose length is sufficiently shorter than the double injection turn-on time, and whose spacing is such that the interval between pulses is sufficiently long to prevent the double injection current from rising to the value of the photo current.

2. A forward biased, double injection semiconductor PIN device;

an electromagnet which produces a magnetic field; and a bias circuit comprising a coil of the electromagnet and connections to the N and P-regions of the PIN device and in series with the coil;

the PIN device being positioned with its I region transverse of the magnetic field whereby an increase in the field depresses the double injection current of the device under forward bias, and thereby controls the electromagnet.

3. A magnetic field regulator for an electromagnet which produces a magnetic field, which comprises:

(a) a two carrier semiconductor device having hole and electron injecting contacts on opposite sides of an I region disposed with the I region transverse to the magnetic field; and (b) a bias circuit connected to the injecting contacts for said device in series with the electromagnet in forward bias direction whereby an increase in the current which energizes the electromagnet increases the magnetic field, which in turn causes a reduction in current through said device.

4. The method of operating a forward biased two carrier photoconductor device having hole and electron injecting contacts on opposite sides of an I region, which comprises:

subjecting the I region of the device to a transverse magnetic field whereby double injection dark current is suppressed; and exposing the I region to radiation whereby higher forward bias voltages may be used, resulting in higher gain.

5. The method according to claim 4 wherein the forward bias voltage is in excess of that at which dark current double injection would otherwise occur.

6. The method according to claim 4 wherein the forward bias voltage is applied in pulses, each larger than the voltage at which double injection currents appear, whose pulse length is sufficiently shorter than the double injection turn-on time, and whose pulse spacing is such that the interval between pulses is sufficiently long to prevent the double injection current from rising to the value of the photo current.

References Cited

UNITED STATES PATENTS

| | | | |
|---|---|---|---|
| 2,908,871 | 10/1959 | McKay | 331—108 |
| 2,986,591 | 5/1961 | Swanson et al. | 136—89 |
| 3,043,959 | 7/1962 | Diemer | 250—211 |
| 3,225,198 | 12/1965 | Mayer | 250—83.3 |
| 3,229,106 | 1/1966 | DeLord et al. | 250—217 |
| 3,245,002 | 4/1966 | Hall | 331—94.5 |
| 3,249,764 | 5/1966 | Holonvak | 307—88.5 |
| 3,265,899 | 8/1966 | Bergstrom et al. | 250—211 |
| 3,267,294 | 8/1966 | Dumke et al. | 307—88.5 |

JOHN W. HUCKERT, *Primary Examiner.*

R. F. SANDLER, *Assistant Examiner.*